United States Patent
Koerzdoerfer et al.

(10) Patent No.: US 11,733,333 B2
(45) Date of Patent: Aug. 22, 2023

(54) METHOD FOR GENERATING AT LEAST ONE IMAGE DATA SET AND ONE REFERENCE IMAGE DATA SET, DATA CARRIER, COMPUTER PROGRAM PRODUCT AND MAGNETIC RESONANCE SYSTEM

(71) Applicant: Siemens Healthcare GmbH, Erlangen (DE)

(72) Inventors: Gregor Koerzdoerfer, Erlangen (DE); Mathias Nittka, Baiersdorf (DE)

(73) Assignee: Siemens Healthcare GmbH, Erlangen (DE)

( * ) Notice: Subject to any disclaimer, the term of this patent is extended or adjusted under 35 U.S.C. 154(b) by 64 days.

(21) Appl. No.: 17/101,389

(22) Filed: Nov. 23, 2020

(65) Prior Publication Data
US 2021/0165061 A1    Jun. 3, 2021

(30) Foreign Application Priority Data
Nov. 28, 2019 (EP) .................................. 19212164

(51) Int. Cl.
*G01R 33/48* (2006.01)
*G01R 33/56* (2006.01)
(Continued)

(52) U.S. Cl.
CPC ....... *G01R 33/482* (2013.01); *G01R 33/5608* (2013.01); *G01R 33/56572* (2013.01); *G06T 7/0012* (2013.01); *G06T 2207/10088* (2013.01); *G06T 2207/20081* (2013.01); *G06T 2207/20084* (2013.01)

(58) Field of Classification Search
CPC .............. G01R 33/482; G01R 33/5608; G01R 33/56572; G01R 33/561; G01R 33/4824; G01R 33/56518; G01R 33/56536; G01R 33/56581; G06T 7/0012;
(Continued)

(56) References Cited

U.S. PATENT DOCUMENTS

2015/0168522 A1* 6/2015 Gulaka ................ G01R 33/561
    324/309
2021/0166447 A1* 6/2021 Koerzdoerfer ........ G06T 11/006

OTHER PUBLICATIONS

Wech, T. et. al., "Using self-consistency for an iterative trajectory adjustment (SCITA)", Magn Reson Med.73:1151-1157, 2015.
(Continued)

*Primary Examiner* — Gregory H Curran
(74) *Attorney, Agent, or Firm* — Banner & Witcoff Ltd.

(57) ABSTRACT

In a method for generating an image data set and a reference image data set: a first raw data set is provided that is acquired with a MR system and that includes measurement signals at read-out points in k-space that lie on a first k-space trajectory; a second raw data set is provided that is acquired with the same MR system and at the same examination object at read-out points that lie on a second, different k-space trajectory that is different from the first k-space trajectory; image data sets are reconstructed from the first raw data set; a reference image data set is reconstructed from the second raw data set; the reference image data set is compared with each image dataset to generate respective similarity values; and an image data set is selected having a greatest similarity value.

20 Claims, 9 Drawing Sheets

(51) Int. Cl.
*G01R 33/565* (2006.01)
*G06T 7/00* (2017.01)

(58) Field of Classification Search
CPC . G06T 2207/10088; G06T 2207/20081; G06T 2207/20084
See application file for complete search history.

(56) References Cited

OTHER PUBLICATIONS

Dan Ma et al: "Magnetic resonance fingerprinting"; Nature, vol. 495, No. 7440, pp. 187-192, XP055183037, ISSN: 0028-0836, DOI: 10 1038/nature11971; 2013.
Tan, H. et al.: "Estimation of k-Space Trajectories in Spiral MRI", in: Magnetic Resonance in Medicine, vol. 61, pp. 1396-1404; 2009.
Duyn, Jeff H. et al. "Simple Correction Method for k-Space Trajectory Deviations in MRI" Journal of Magnetic Resonance, vol. 132, Issue 1, pp. 150-153, Article No. MN981396; May 1998.
Bucholz E. et. al., "Multi-spectral imaging with three-dimensional rosette trajectories", Magn Reson Med.; 59(3):581-589. doi:10.1002/mrm.21551; Mar. 2008.
Krämer M. et al; Intrinsic correction of system delays for radial magnetic resonance imaging; Magnetic Resonance Imaging; vol. 33; No. 4; pp. 491-496; XP055705947; ISSN: 0730-725X; DOI: 10.1016/j.mri.2015.01 .005; Tarrytown; NY; US; 2015.
Campbell-Washburn Adrienne E.; "Real-time distortion correction of spiral and echo planar images using the gradient system impulse response function"; Magnetic Resonance in Medicine; vol. 75; No. 6; pp. 2278-2285; XP055708313; ISSN: 0740-3194; DOI: 10.1002/mrm.25788; US; 2015.
Vannesjo, Signe J. et al. "Gradient System Characterization by Impulse Response Measurements with a Dynamic Field Camera" Magnetic Resonance in Medicine, vol. 69, pp. 583-593; 2013.
Jiang Wenwen et al; "Simultaneous auto-calibration and gradient delays estimation (SAGE) in non-Cartesian parallel MRI using low-rank constraints"; Magnetic Resonance in Medicine; vol. 80; No. 5; pp. 2006-2016; XP055705953; ISSN: 0740-3194; DOI: 10.1002/mrm.27168; US; 2018.
Rosenzweig Sebastian et al; "Simple auto-calibrated gradient delay estimation from few spokes using Radial Intersections (RING)"; Magnetic Resonance in Medicine; vol. 81; No. 3; pp. 1898-1906; XP055705955; ISSN: 0740-3194; DOI: 10.1002/mrm.27506; US; 2018.
Barmet, Christoph et al. "Spatiotemporal Magnetic Field Monitoring for MR" Magnetic Resonance in Medicine, vol. 60, pp. 187-197; 2008.
Ianni Julianna D. et al; "Trajectory Auto-Corrected image reconstruction"; Magnetic Resonance in Medicine; vol. 76; No. 3; pp. 757-768; US; XP055349313; ISSN: 0740-3194; DOI: 10.1002/mrm.25916; Sep. 12, 2015.
Takahashi A. et al; "Compensation of multi-dimensional selective excitation pulses using measured k-space trajectories"; Magnetic Resonance in Medicine; John Wiley & Sons; Inc; US; vol. 34; pp. 446-456; XP002590596; ISSN: 0740-3194; 1995.
European Search Report dated Aug. 12, 2020, Application No. 19212164.8 (with English-language computer translation).

* cited by examiner

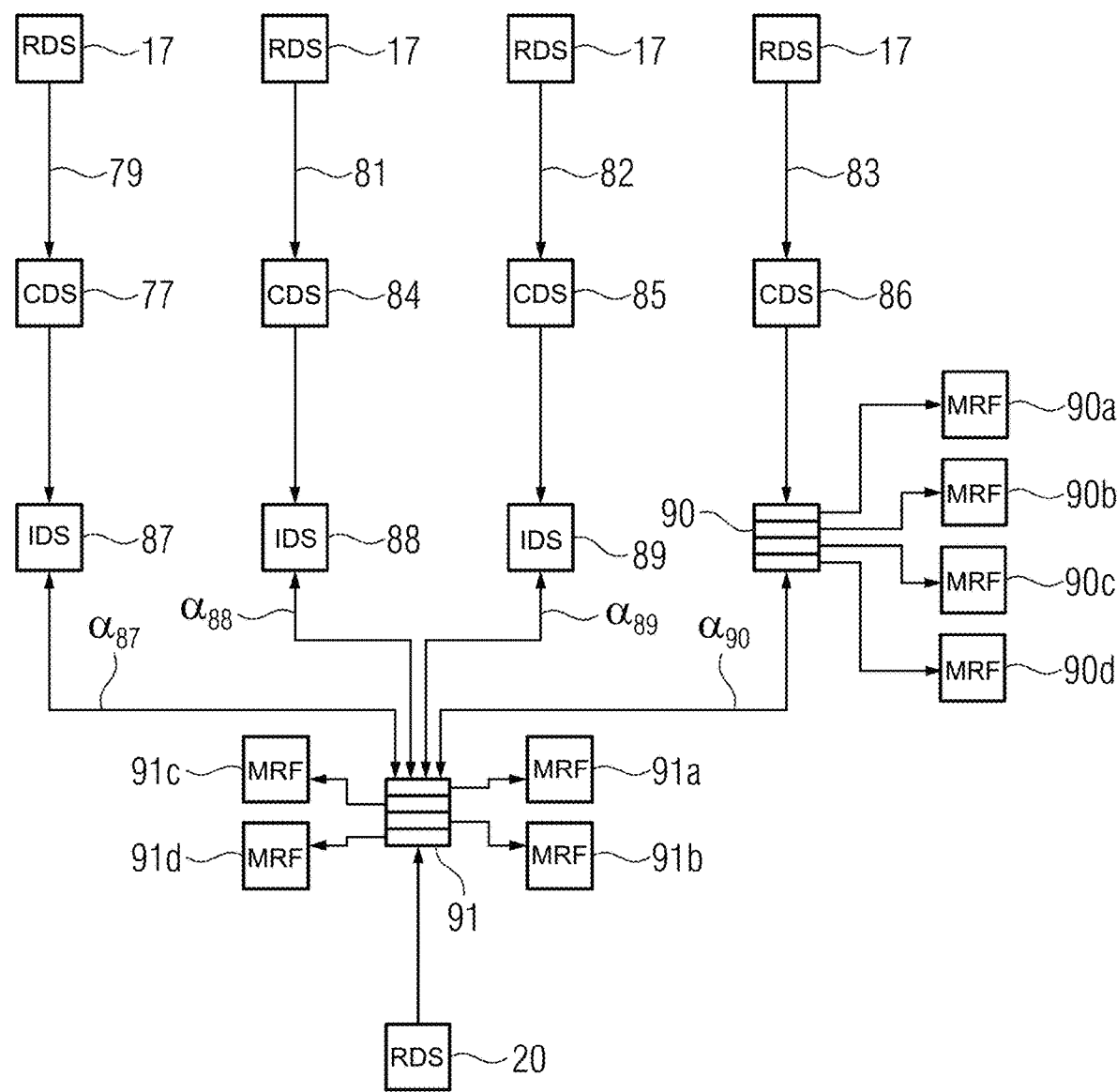

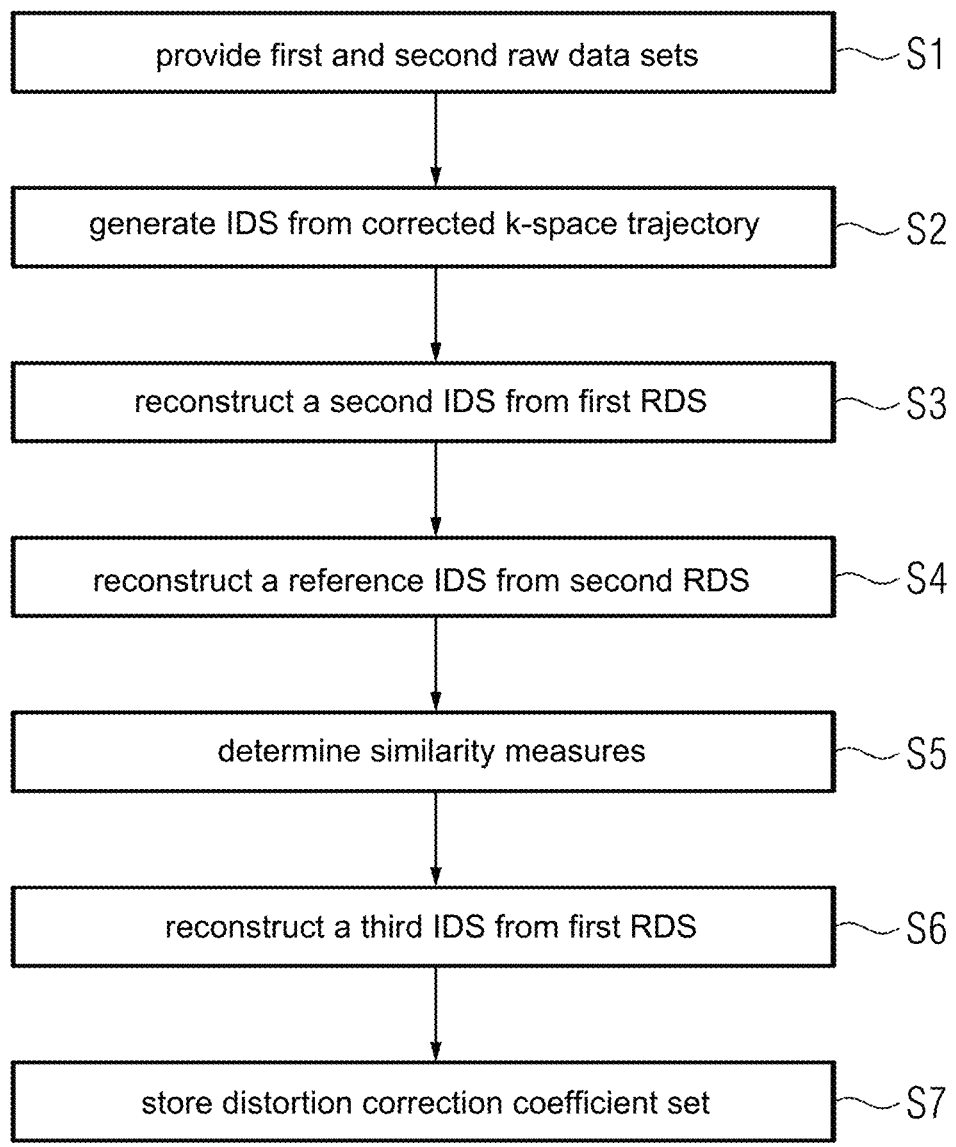

METHOD FOR GENERATING AT LEAST ONE IMAGE DATA SET AND ONE REFERENCE IMAGE DATA SET, DATA CARRIER, COMPUTER PROGRAM PRODUCT AND MAGNETIC RESONANCE SYSTEM

CROSS REFERENCE TO RELATED APPLICATIONS

This patent application claims priority to European Patent Application No. 19212164.8, filed Nov. 28, 2019, which is incorporated herein by reference in its entirety.

BACKGROUND

Field

The disclosure relates to a method for generating at least one image data set and one reference image data set of an examination object from at least two raw data sets. The disclosure relates, moreover, to a computer program product, a data carrier and a magnetic resonance system with which said method can be carried out.

Related Art

In magnetic resonance imaging, measurement sequences are used for acquiring raw data sets from which image data sets are processed. With a measurement sequence, what is known as the k-space (for example defined as the spatial frequency space of the spin density distribution) is sampled, with measurement signals being acquired in a spatially encoded manner at a large number of read-out points.

Depending on the sampling pattern, reference is made, for example, to Cartesian, spiral or radial sampling of the k-space. The path with which the k-space is sampled in the process is called the k-space trajectory in this connection.

With Cartesian sampling, a read gradient is conventionally applied during the acquisition window, whereby an entire k-space row can be acquired. Depending on the measurement sequence, sampling is performed row for row with waiting times therebetween. With an Echo Planar Imaging (EPI) measurement sequence, by contrast, a large number of k-space rows are read out directly one after the other.

There can also be a waiting time or a multi-echo acquisition can be made between acquisition of the individual spokes, which do not correlate with the rows already described, in the case of radial sampling.

At least some of the k-space is sampled with a read gradient that varies over time in the case of spiral trajectories.

The sampling pattern is basically independent of the actual measurement sequence. A measurement sequence is a predefined sequence of radio frequency (RF) pulses, magnetic field gradients, acquisition windows and waiting times. Examples of such measurement sequences are a gradient echo (GE) measurement sequence, a spin echo (SE) measurement sequence, Fast Low Angle SHot (FLASH), a Fast Imaging with Steady Precession (FISP) measurement sequence, a True Fast Imaging with Steady Precession (TrueFISP) measurement sequence, a Turbo Spin Echo (TSE) measurement sequence, an Echo Planar Imaging (EPI) measurement sequence, and many others.

Each of said sampling patterns can be used in particular with a FLASH, FISP or TrueFISP measurement sequence.

Magnetic field gradients are used for the purpose of spatial encoding. Conventionally, a magnetic resonance system designed for imaging has three gradient coils for generating three gradient fields. These are perpendicular to each other to enable spatial encoding in all spatial directions.

Targeted application of gradients in a first and a second image direction, for example a read direction and a phase-encoding direction, defines the read-out points, in other words, the position of the measurement signals in the k-space.

If the actual gradient fields differ from the assumed ones, the read-out points are consequently also shifted in the k-space. For example, the gradients can have a strength different to the assumed one or their duration is shorter or longer than specified. Consequently, measurement signals are acquired at different positions in the k-space to the assumed ones, whereby artifacts are produced in the reconstructed image data set.

Such deviations can lead, in particular with spiral k-space trajectories or measurement sequences with multi-gradient echo read-outs, as with an EPI measurement sequence, to pronounced artifacts.

In reality, spiral trajectories are distorted, for example by gradient amplifier time shifts, eddy currents and accompanying gradient fields, also called concomitant gradient fields. These effects can be different from magnetic resonance system to magnetic resonance system and have to be precisely examined and optionally individually calibrated, therefore.

There is a large number of correction models for spiral trajectories, for example Tan et Meyer: Estimation of k-space trajectories in spiral MRI, Magn. Reson. Med., 2009, 61(6): 1396-1404. Furthermore, there are also more general methods, which describe any gradient pulses, for example Duyn J. H., Yang Y., Frank J. A., van der Veen J. W.: Simple correction method for k-space trajectory deviations in MRI, J Magn. Reson., 1998, 132(1):150-3 or Vannesjo S J, Haeberlin M, Kasper L, Pavan M, Wilm B J, Barmet C, Pruessmann K P: Gradient system characterization by impulse response measurements with a dynamic field camera, Magn. Reson. Med., 2013; 69(2):583-93.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIG. 8 shows a method for generating an image data set according to an exemplary embodiment of the disclosure.

FIG. 9 shows a method for generating an image data set according to an exemplary embodiment of the disclosure.

Figure 1:
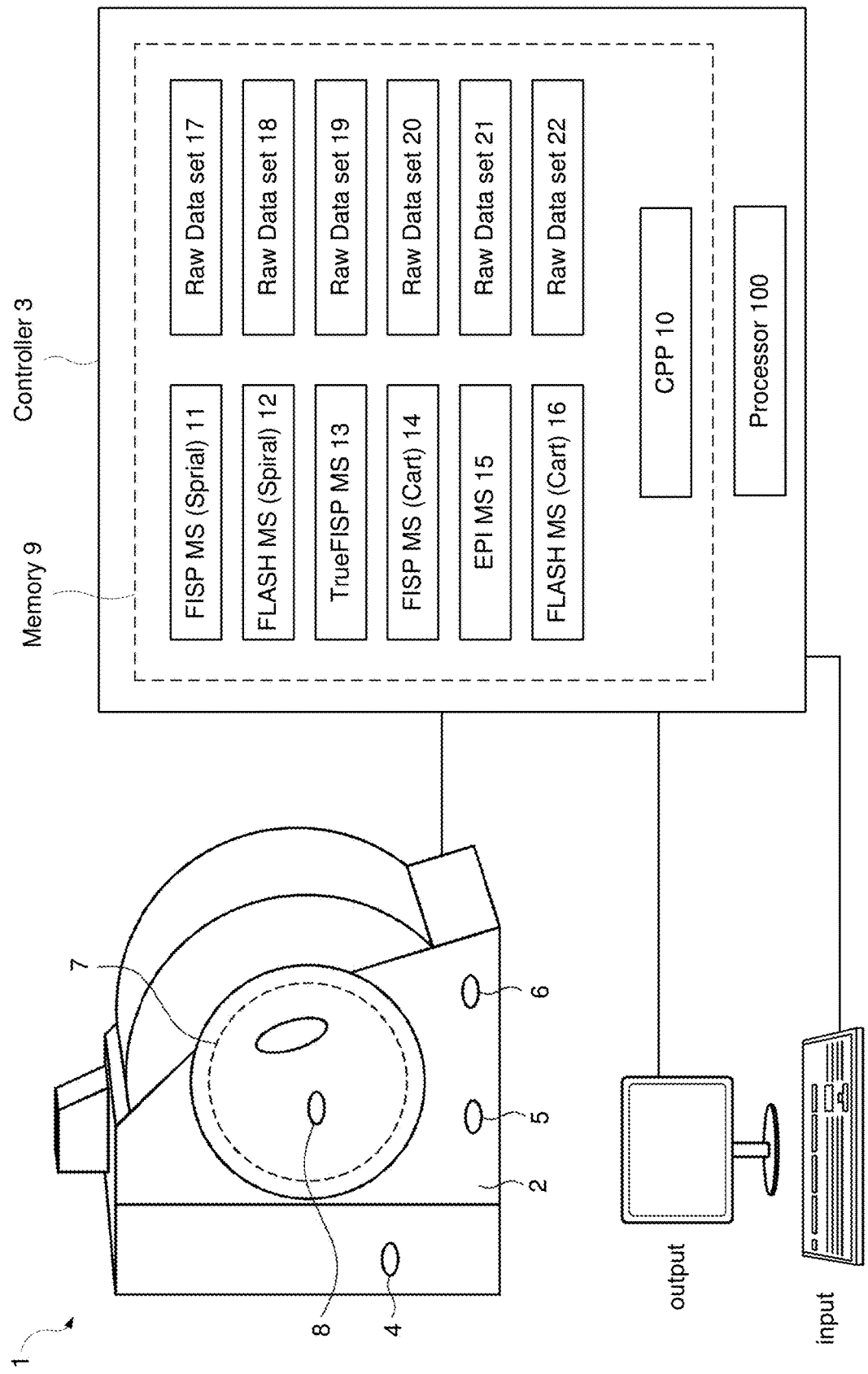
FIG. 1 shows a magnetic resonance system according to an exemplary embodiment of the disclosure.

The exemplary embodiments of the present disclosure will be described with reference to the accompanying drawings. Elements, features and components that are identical, functionally identical and have the same effect are 13 insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the present disclosure to implement a method of simple and robust trajectory correction in particular for spiral k-space trajectories.

This object is achieved by the methods for generating at least one image data set and one reference image data set of an examination object from at least two raw data sets, according to exemplary aspects. In an exemplary embodiment, the method includes:

providing a first raw data set, wherein the first raw data set is acquired with a magnetic resonance system and comprises measurement signals at a plurality of read-out points in the k-space, wherein the read-out points lie on a first k-space trajectory, providing a second raw data set, wherein the second raw data set is acquired with the same magnetic resonance system and is acquired at the same examination object as the first raw data set and comprises measurement signals at a plurality of read-out points in the k-space, wherein the read-out points lie on a second k-space trajectory that is different from the first k-space trajectory, reconstruction of a plurality of image data sets from the first raw data set, wherein before the reconstruction of each image data set, a separate distortion correction coefficient set is used, wherein a distortion correction coefficient set defines a shift of the read-out points of the measurement signals of the first raw data set in the k-space, reconstruction of a reference image data set from the second raw data set, comparison of the image data sets with the reference image data set, wherein on comparison, one similarity value respectively is generated, and selection of the image data set with the greatest similarity value.

As is known, the k-space is the sampled frequency space. It is a mathematical data space in which the measurement signals can be represented in the form of k-space points. The Nyquist criterion defines how many k-space points have to be sampled to obtain a reconstruction without convolution artifacts. Such a k-space is also called "complete". Subsampling leads, by contrast, to what are known as convolution artifacts. There are types of acquisition, for example parallel imaging, in which image data sets free from convolution artifacts can also be obtained from sub-sampled k-spaces with specific reconstruction methods.

Several possibilities exist for sampling the k-space. Different samplings can also result with Cartesian sampling over the sequence of acquisition of the k-space rows, therefore. The path in the k-space, which is defined by the gradient fields after the RF excitation(s), is what is known as the k-space trajectory. This can be visualized in k-space representations. The k-space trajectory shows the path of the acquisition of all measurement signals, therefore, which are included in a raw data set. A k-space trajectory can also comprise partial trajectories, therefore.

The k-space points, which were actually sampled, are called read-out points. The measurement signals, which were acquired, are stored in a raw data set (already mentioned).

A magnetic resonance system with a receive coil arrangement and gradient coils is designed to acquire raw data sets with different measurement sequences. Consequently, the image data sets reconstructed from a raw data set can have different contrasts. Different sampling patterns can also be used when the same measurement sequence is used, resulting in different k-space trajectories.

It has been found that some k-space trajectories are more sensitive to gradient deviations than others such that they have a greater tendency toward deviations between actual and desired trajectory than others. Two raw data sets are provided, therefore, which are acquired with different k-space trajectories. The k-space trajectory which is less sensitive to gradient deviations can be used to correct the more sensitive k-space trajectory.

This occurs by way of the targeted shift in the read-out points. The shift vectors of the individual read-out points are combined in a distortion correction coefficient set. With a distortion correction coefficient set, preferably the first raw data set is transformed into a corrected first raw data set and then reconstructed by a Fourier transform into an image data set. A separate image data set then exists for each distortion correction coefficient set.

These image data sets, which have all been reconstructed from the first raw data set using a different distortion correction coefficient set respectively, are then compared with a reference image data set reconstructed from the second raw data set. On comparison, a similarity value is generated and the image data set with the greatest similarity value continues to be used.

One of the distortion correction coefficient sets can also represent identity imaging, in other words, not implement a shift. Without gradient deviations, the image data set reconstructed using this distortion correction coefficient set is the one with the greatest similarity value.

The similarity value is advantageously defined by an edge comparison. When determining the similarity, primarily the structure is then considered and not signal intensity distributions.

The described method can be used in four repetition frequencies:

It can be carried out once in the calibration of a new type of magnetic resonance system. A detected distortion correction coefficient set can then be used for all magnetic resonance systems of this type.

It can be carried out on setup of any magnetic resonance system. Consequently, device-specific features can be taken into account.

If the position of the patient and the gradient settings associated therewith affect the correction, the method has to be carried out for each patient.

If, however, the actual measurement parameters are problematic, a separate implementation is necessary for each measurement sequence.

A distortion correction coefficient set is stored for future corrections in the first three cases.

In an exemplary embodiment, a trajectory can be used as the first k-space trajectory in which at least some of the k-space is sampled with read gradients that vary over time, in particular a spiral trajectory, in other words, a spiral k-space trajectory, can be used. As described in the introduction, spiral trajectories are sensitive to gradient deviations since the gradients used have a large number of changes and deviations add up. Each read-out point has a different shift, therefore. As has also been described above, a k-space trajectory denotes the entirety of all measurement signals, which are used for reconstruction of an image data set. A spiral k-space trajectory can have a spiral, therefore. It can also have at least two, in other words, a plurality of, spirals, however.

For the generation of spiral trajectories, measurement sequences are used, which are provided with two oscillating gradients.

Alternatively, a path with at least two connected k-space lines can be used as a first k-space trajectory. A k-space line can be a k-space row or a spoke. In an exemplary embodiment, two successive k-space lines respectively have a different, in particular an opposing, read-out direction. A k-space trajectory of this kind is present inter alia with multi-gradient echo measurement sequences such as an EPI measurement sequence. Gradient deviations, in particular of the read gradient, add up also in the case of measurement sequences of this kind. In an exemplary embodiment, the k-space-lines have as k-space rows a spacing in the phase-encoding direction, in other words, are sampled in a Cartesian arrangement. Alternatively, the k-space lines can also be obtained as spokes with radial sampling.

Connection of the k-space lines results by reading out a multi-gradient echo, therefore. The rows or spokes are actually connected in a k-space representation.

The k-space can be sampled in a single pass, as what is known as "single-shot" sampling, or in a segmented manner. The more k-space lines that are acquired in one pass, the greater the susceptibility in relation to gradient deviations.

Other complicated trajectories are conceivable, moreover, such as Rosette (https://www.ncbi.nlm.nih.gov/pmc/articles/PMC2746043/) or basically trajectories in which the read-out direction changes.

Advantageously, a Cartesian distribution of the read-out points can be used as the second k-space trajectory. This can preferably be acquired with a measurement sequence in which only a few or preferably a single gradient echo is acquired. The k-space trajectory then consists of individual, unconnected k-space rows or of blocks of a few unconnected rows. With Cartesian trajectories, the shift in the k-space caused by gradient deviations is typically exactly the same for each row since they all point in the same direction. Not many gradient echoes denotes fewer gradient echoes than with the first raw data set, in particular a maximum of 10 gradient echoes. Advantageously, a single gradient echo is acquired in one pass.

The feature of not many or of the single gradient echo(es) also includes all imaging spin echo and mixed measurement sequences. A gradient echo is generated at the same time as the spin echo by means of a read dephasing gradient and the following read gradients in the case of spin echo measurement sequences as well.

In an exemplary embodiment, only one of the first gradient echo signals or the first gradient echo signals is/are used for the reconstruction of the reference image data set. If a turbo spin echo measurement sequence is combined together with a 2 point Dixon method on acquisition of the raw data, then the second gradient echo respectively is used for generating a second image data set. Such gradient echoes are irrelevant to the reference image data set, however, which is advantageously reconstructed from the first gradient echoes respectively.

Alternatively, a path with unconnected spokes or not many connected spokes can be used as the second k-space trajectory. A radial sampling with a single or not many gradient echo signal(s) is also possible, therefore. Here too the few gradient echo signals are fewer gradient echo signals than with the first raw data set, preferably a maximum of 10 gradient echo signals.

In an exemplary embodiment, a model of the gradient deviation on acquisition of the first raw data set can be used in the generation of at least one distortion correction coefficient set. All causes of deviations, which are known, can be included in the model. It is not necessary for the deviations to be known exactly for this, otherwise they could be considered from the start when establishing the measurement parameters.

However, the model can also include whether the gradient moments have a tendency to be too big or too small, whether the deviation is merely present or is present more strongly in a particular direction, what effects eddy currents have, etc. Specifically adapted distortion correction coefficient sets can be generated in respect of the identified deviations, therefore.

If it is known, for example, that the gradient deviations cause a shift only in the read direction, a distortion correction coefficient set shifts the read-out points only in the read direction. Since the strength of the shift is not known, shifts of different strengths are "tested" and one image data set respectively is generated using one distortion correction coefficient set.

Furthermore, smaller shifts can be provided in the center of the k-space than further out, since the gradient strengths are lower in the center. All of the previous knowledge about the gradients can be packed into the distortion correction coefficient sets to achieve a distortion correction with optimally few distortion correction coefficient sets.

Alternatively or in addition, at least one distortion correction coefficient set can be generated with random numbers. In a first embodiment, the shifts for each distortion correction coefficient set are generated solely with random numbers. This is a type of brute force attack. This process can always be applied since it does not assume any previous knowledge. It is usually inefficient, however.

In a second alternative, use of the random numbers with the application of previous knowledge, for example the model of the gradient deviation on acquisition of the first raw data set, can be combined. Model errors can be intercepted without reaching, as it were blindly, for shift values. A combination can for example be obtained in that limit values are specified for the random numbers as a function of location. As described further above, the gradient deviations can be greater at the edge. There the limit values for the random numbers are likewise higher. In addition or as an alternative, shifts are determined with the random numbers only for directions in which a deviation is anticipated. Any model can be combined with random numbers, therefore to keep the models more robust against unconsidered effects.

Advantageously, a maximum shift can be specified for the measurement signals. The aim here is to keep the shifts in a physically expedient range. While limit values are already specified for the numbers as such when using random numbers, the shift resulting therefrom can be provided with additional conditions. For example, it is possible to specify that two read-out points located side by side on the k-space trajectory do not change place. Here too the aim is to limit the number of distortion correction coefficient sets used to an optimally low number.

In an exemplary embodiment, a plurality of partial data sets can be provided as the first raw data set, wherein the partial data sets are acquired with at least one different measurement parameter comprising the group: flip angle of the excitation pulse and/or repetition time. A particularly valuable application of the described method occurs with Magnetic Resonance Fingerprinting (MRF) or MR fingerprinting for short. With MR fingerprinting, image data sets with different measurement parameters are acquired directly one after the other to generate signal curves, which are influenced by a plurality of tissue and device parameters, for example by the T1 relaxation time and/or the T2 relaxation time and/or the RF pulse strength B1 or the basic field strength B0.

Each signal curve is compared with the signal curves stored in what is known as a dictionary and the tissue and device parameters are thus determined. Each signal curve is obtained from a large number of MRF image data sets, and, more precisely, conventionally for each image element, one signal curve.

To be able to acquire the large number of MRF image data sets, and, more precisely, in the order of several hundred, in a reasonable period of time, it is known to use spiral trajectories when acquiring an MRF image data set. The situation can occur here that an MRF image data set is sub-sampled 48 times. To reduce the sub-sampling when generating a first raw data set, one spiral k-space trajectory can be formed from a plurality of spirals. For this, the spirals must have at least partially different read-out points, otherwise only an averaging would exist. For example, the spirals can be rotated towards each other by an angle. With four spirals, there can be a 90° turn in each case.

A spiral will be used for generating an MRF image data set, therefore and a plurality of, for example four, spirals form a first raw data set for generating an image data set. Consequently, the spirals can be used not only for an MRF method but simultaneously for a preceding distortion correction.

An MRF raw data set, the measurement signals located on a spiral, therefore, which is used to reconstruct an MRF image data set, represents a partial data set of a first raw data set thereby.

When providing or acquiring the MRF image data sets an additional task, therefore, is to obtain a correction for one or more first raw data set(s), which does not lengthen the measuring time, or at least not significantly.

In order to solve this problem it is proposed, therefore, when acquiring the MRF image data sets, to acquire some with spiral sampling and some with Cartesian sampling. The method described in the introduction should be supplemented such that measurement parameters are varied during the measurement.

In addition, the measurement sequence can also be varied, with the magnetization being taken over from measurement sequence to measurement sequence by direct succession of the measurement sequences in the case of MR fingerprinting.

An MRF data set acquired in this way is then composed of a plurality of first raw data sets and at least one second raw data set. Each of the first raw data sets can be composed of a plurality of partial data sets. A plurality of MRF image data sets is then generated therefrom. The process for obtaining a corrected k-space trajectory should be differentiated herefrom, however. In this case a whole first raw data set is used despite the different measurement parameters. In the whole first raw data set the read-out points are shifted by means of a distortion correction coefficient set and a single image data set—for each distortion correction coefficient set—is generated therefrom. If the k-space trajectory in which the similarity value is at a maximum is found, it can be used to reconstruct the plurality of MRF image data sets from the single k-space spiral trajectory.

While both the image data sets from the k-space spiral trajectory and the MRF image data sets from the spirals can be sub-sampled, the MRF image data sets are sub-sampled significantly more strongly. The use of the first raw data sets instead of the individual spirals means that only the calculation of expedient similarity values is possible. Distortion correction coefficient sets can be provided for any type of k-space trajectory, although with excessively sub-sampled raw data sets there is the problem that the image data sets reconstructed therefrom have excessive convolution artifacts. In this case it is no longer possible to create expedient similarity values with one reference image data set.

In an exemplary embodiment, a plurality of first raw data sets can be provided and a distortion correction coefficient set selected for a first raw data set, which is used for all first raw data sets or for partial data sets of the first raw data sets. This is similarly an application in the case of MRF fingerprinting, in particular when using different measurement sequences in the case of spiral sampling. For an image data set, that distortion correction coefficient set which leads to the greatest similarity value is then determined. This can then be applied to other first raw data sets to correct them as well.

Insofar as, previously, storage of the distortion correction coefficient set was irrelevant, this process represents a modification since it was not imperatively used further. For example, the distortion-corrected raw data set, in other words, the first raw data set with shifts already applied, could also be stored.

In an exemplary embodiment, after the reconstruction of at least two image data sets from the first raw data set using two different distortion correction coefficient sets, the resulting similarity values are considered when generating a third distortion correction coefficient set. In other words, the distortion correction coefficient sets and the image data sets can be generated iteratively. Using the image data sets an evaluation is made as to which distortion correction coefficient sets produce an improvement or which bring about a greater improvement and an attempt is then made to improve them further. For example, a first distortion correction coefficient set can perform shifts in the center of the k-space and a second set can perform shifts in the outer regions of the k-space. Depending on which of the image data sets generated from the first raw data set using the first and the second distortion correction coefficient sets has a greater similarity value, the distortion correction coefficient set, which is associated with the image data set with the greater similarity value, is modified.

In an exemplary embodiment, the first raw data set can be acquired with a first measurement sequence and the measurement sequence for acquisition of the second raw data set can be selected such that image data sets reconstructed from the first and the second raw data sets have, as far as possible, equal contrasts. The gradient deviations cause a change in the contours in an image data set reconstructed from a first raw data set. The distortion correction coefficient set is intended to reverse this change. A comparison, for example, of the edges in an image data set and in the reference image data set then shows how well the distortion correction has worked. In particular, the first raw data set and the second raw data set can be acquired with the same measurement sequence, but different k-space trajectories.

Advantageously, a distortion correction coefficient set can also define a phase shift. A phase shift can be produced by local off-resonances, in other words, by local magnetic field strengths different from the anticipated B0. These are caused by inhomogeneities of the basic magnetic field of the magnetic resonance system or by susceptibility differences of tissues of the patient. The phase is a further parameter, which is present in the distortion correction coefficient set. This makes the distortion correction slightly more complex, but ultimately even better.

In addition, the disclosure relates to a method for training an artificial neural network, comprising:
  receiving input training data, where the input training data is the first raw data set according to one or more embodiments,
  receiving output training data, where the output training data is the second raw data according to one or more exemplary embodiments,
  training the neural network with the input and output training data, in particular by back propagation, and
  providing the trained neural network.

A plurality of first raw data sets is produced in the case of MRF. For each of these an optimum distortion correction coefficient set can be determined (as described above) for training the artificial neural network. This data can then also be used to train a neural network.

With the trained neural network, it is possible, instead of the fixed incorporation of raw data sets with a second k-space trajectory, in particular with Cartesian sampling, for generating reference image data sets, to use these only for training the artificial neural network and to then use MRF data sets again in which only k-space spiral trajectories were used when sampling the k-space.

In addition, the disclosure relates to a method for generating at least one image data set using a trained neural network as described, having the following steps:
  providing a first raw data set, wherein the first raw data set is acquired with a magnetic resonance system and comprises measurement signals at a plurality of read-out points in the k-space, wherein the read-out points lie on a first k-space trajectory,
  applying the trained neural network as described to the first raw data set, whereby a corrected first raw data set is generated, and
  reconstruction of an image data set from the corrected first raw data set.

Once the neural network is trained it can be used for the distortion correction of the first raw data sets. In the context of MRF, a plurality of MRF image data sets can be reconstructed, as described, from a corrected or distortion-corrected first raw data set.

Furthermore, the present disclosure relates to a computer program product, which can be loaded into a memory of a programmable controller or an arithmetic unit of a magnetic resonance system. With this computer program product, all or different embodiments (described above) of the inventive method can be carried out when the computer program product runs in the controller. The computer program product potentially requires program means, for example libraries and help functions, to implement the corresponding embodiments of the method. In other words, the aspects directed toward the computer program product is intended, in particular, to protect software with which one of the above-described embodiments of the inventive method can be carried out or which carries out this embodiment. The software can be a source code (for example C++), which still has to be compiled and linked or which only has to be interpreted, or an executable software code, which for execution merely has to be loaded into the corresponding arithmetic unit or controller.

In addition, the disclosure relates to a data carrier for a controller for controlling a computer, in particular a data generator of a magnetic resonance system and/or an evaluation unit, with data for carrying out the described method. Advantageously, the data generator can be an image generator. The evaluation unit can be part of the magnetic resonance system or be an external unit. The data carrier can then also be a permanently accessible memory of the magnetic resonance system. It does not have to be installed in the controller of the magnetic resonance system for this; it can also be designed as a storage service or Cloud server.

Said methods can be implemented in the controller as software or as (hard-wired) hardware.

In addition, the disclosure relates to a magnetic resonance system with a controller. The magnetic resonance system is characterized in that the controller is designed for carrying out the method as described.

Further advantageous embodiments of the inventive magnetic resonance system correspond to analogous embodiments of the inventive method. To avoid unnecessary repetitions, reference will be made to the corresponding method features and their advantages, therefore.

FIG. 1 shows a magnetic resonance (MR) system 1 according to an exemplary embodiment that includes a scanner 2 and a controller 3. The scanner 2 has three gradient coils 4, 5 and 6 for generating gradient fields. There is also a transmit coil arrangement 7 present on the scanner 2. The transmit coil arrangement 7 can be configured as a body coil. The transmit coil arrangement 7 can also be a transmit coil array, however. In an exemplary embodiment, the controller 3 includes processor circuitry 100 that is configured to perform one or more functions and/or operations of the controller 3. For example, the processor circuitry 100 may be configured to execute one or more executable instructions (e.g. of the computer program product 10) to perform one or more functions and/or operations of the controller 3 (e.g. perform the method according to one or more aspects of the disclosure). The processor circuitry 100 may also be configured to control the overall operation of the MR system 1.

The transmit coil arrangement 7 can also be used for signal reception. To increase the signal-to-noise ratio SNR it is also known, to use local coils, however. In particular, a coil array can be used as the receive coil arrangement 8 for carrying out parallel imaging. The measuring time can be shortened with a coil array.

The controller 3 of the magnetic resonance system 1 has a data carrier (memory) 9 on which a computer program product 10 for carrying out the described method is stored. A FISP measurement sequence 11 with spiral k-space sampling, a FLASH measurement sequence 12 with spiral k-space sampling, a TrueFISP measurement sequence 13 with spiral k-space sampling and a FISP measurement sequence 14 with Cartesian k-space sampling of unconnected rows can also be stored on the data carrier 9.

Furthermore, an EPI measurement sequence 15 with Cartesian k-space sampling and a FLASH measurement sequence 16 with Cartesian k-space sampling can also be stored.

The FISP measurement sequence 11 can be used for acquiring a first raw data set 17. A first raw data set 18 can be acquired with the FLASH measurement sequence 12. The TrueFISP measurement sequence 13 can be used for acquisition of a first raw data set 19. A second raw data set 20 can be obtained with the FISP measurement sequence 14 by contrast.

Similarly, a first raw data set 21 can be obtained with the EPI measurement sequence 15 and a second raw data set 22 with the FLASH measurement sequence 16.

Further conventional components of the magnetic resonance system 1 such as a patient couch, etc. are not shown for the sake of clarity.

Figure 2:
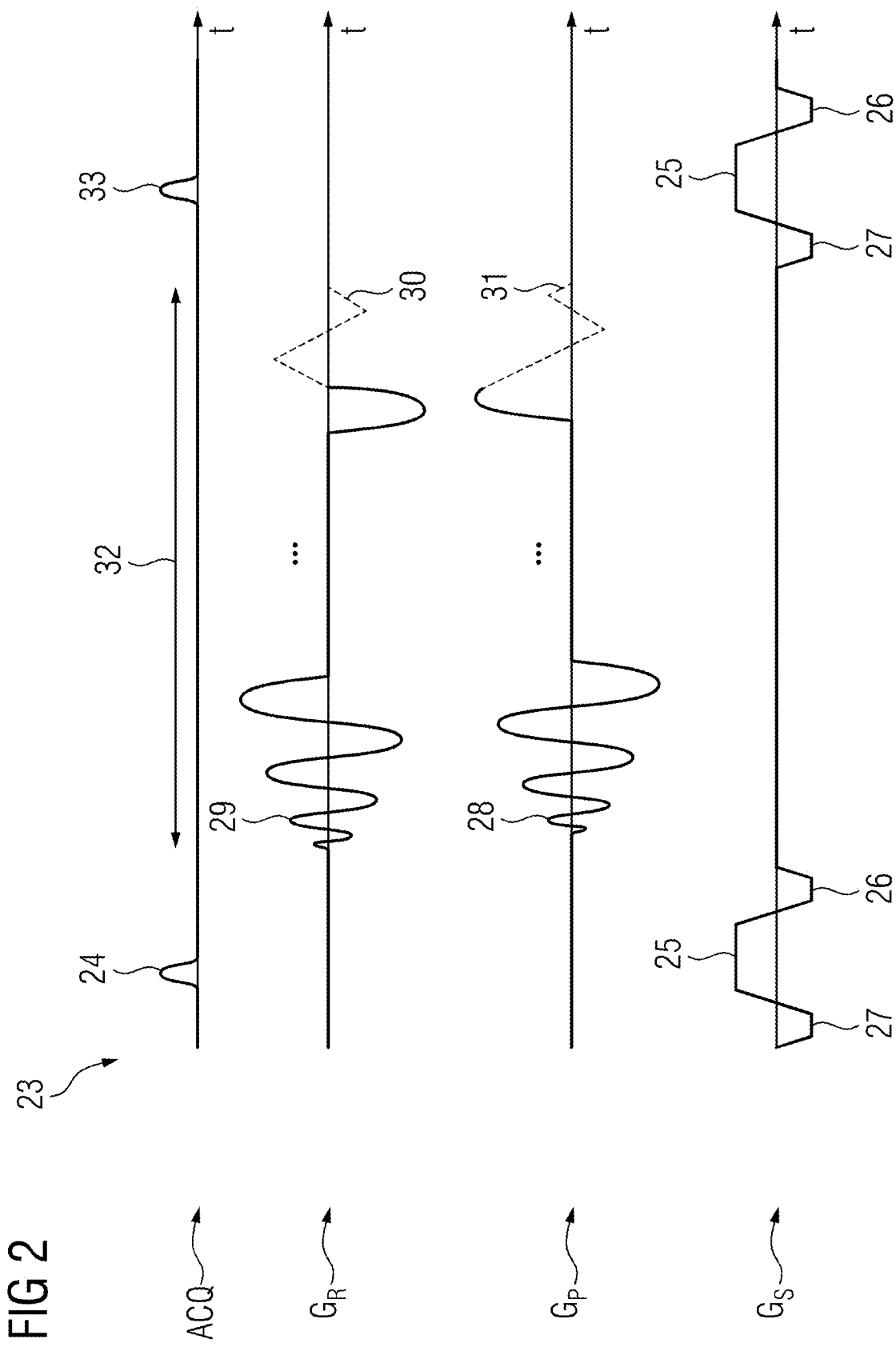
FIG. 2 shows a TrueFISP sequence diagram according to an exemplary embodiment of the disclosure.

FIG. 2 shows a TrueFISP sequence diagram 23 for the TrueFISP measurement sequence 13. The gradient axes are labeled, as is customary, with $G_R$ for the read direction, $G_P$ for the phase-encoding direction and $G_S$ for the slice selection direction. ACQ designates the axis for the radio frequency pulses and acquisition windows.

To excite just one slice with the radio frequency pulse 24, a slice selection gradient 25 is applied in the slice selection direction $G_S$ at the same time as the radio frequency pulse 24. To compensate the dephasing effect thereof on the magnetization in the transverse plane, a slice re-phasing gradient 26 directly follows the slice selection gradient 25. In addition to this gradient there is also a slice dephasing gradient 27 in the slice selection direction $G_S$. This ensures that the TrueFISP measurement sequence 13 is "balanced" over a repetition time $T_R$. In other words, over a repetition time $T_R$ the totals of the gradient moments in the slice selection direction $G_S$ is zero.

A phase-encoding gradient 28 is used in the phase-encoding direction $G_P$. Like the read gradient 29 in the read direction $G_R$, this is applied so as to oscillate. This embodiment is used to sample the k-space spirally.

In order to balance the gradient moments there is a read-rewind gradient 30 and a phase-rewind gradient 31 at the end of the gradients applied so as to oscillate. These are shown in broken lines in order to better differentiate them from read gradient 29 and phase-encoding gradient 28. The TrueFISP measurement sequence 13 is thereby "fully balanced" over a repetition time $T_R$, in other words, over a repetition time $T_R$ the totals of the gradient moments is zero in all directions.

The measurement signals 32 are acquired in the acquisition phase.

Figure 6:
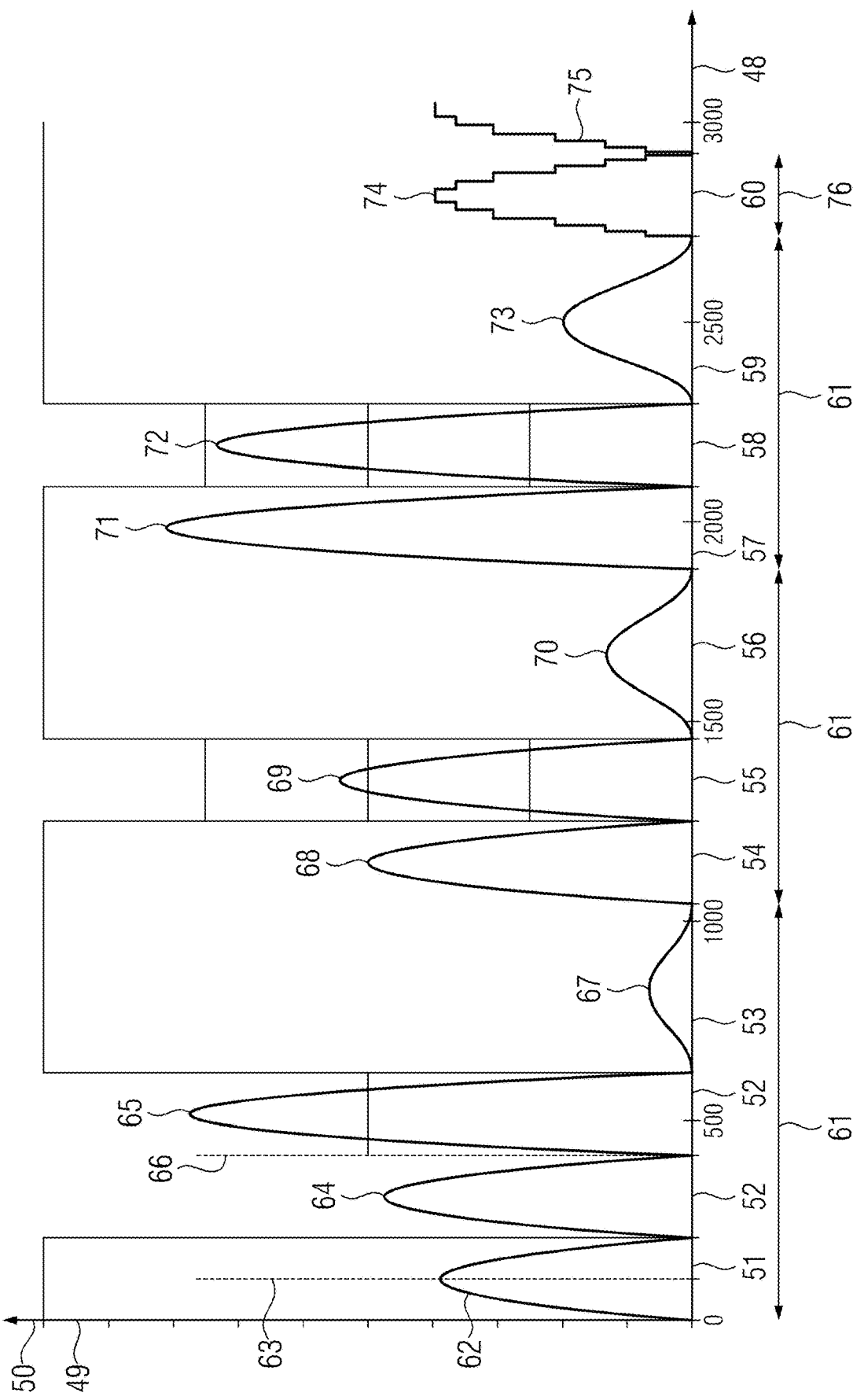
FIG. 6 shows a Magnetic Resonance Fingerprinting (MRF) method with a plurality of measurement sequences according to an exemplary embodiment of the disclosure.

Acquisition of a further raw data set is begun with the radio frequency pulse 33. This has a different flip angle to the preceding radio frequency pulse 24. FIG. 6 shows possible variations of the flip angle.

With a FISP measurement sequence 11, at least the slice-dephasing gradient 27 is omitted in the comparison with the TrueFISP measurement sequence 13, optionally also the read-rewind gradient 30. A FISP measurement sequence 11 is only balanced in the phase direction $G_P$, therefore and possibly in the read direction $G_R$, but not in the slice selection direction $G_S$.

In contrast to a TrueFISP sequence 13, a FLASH measurement sequence 12 is not balanced in any direction. The slice-dephasing gradient 27, the read-rewind gradient 30 and the phase-rewind gradient 31 are missing, therefore.

Owing to the otherwise high level of consistency, only a TrueFISP sequence diagram 23 was shown, therefore. The modifications for a FISP measurement sequence 11 and a FLASH measurement sequence 12 result as described.

Figure 3:
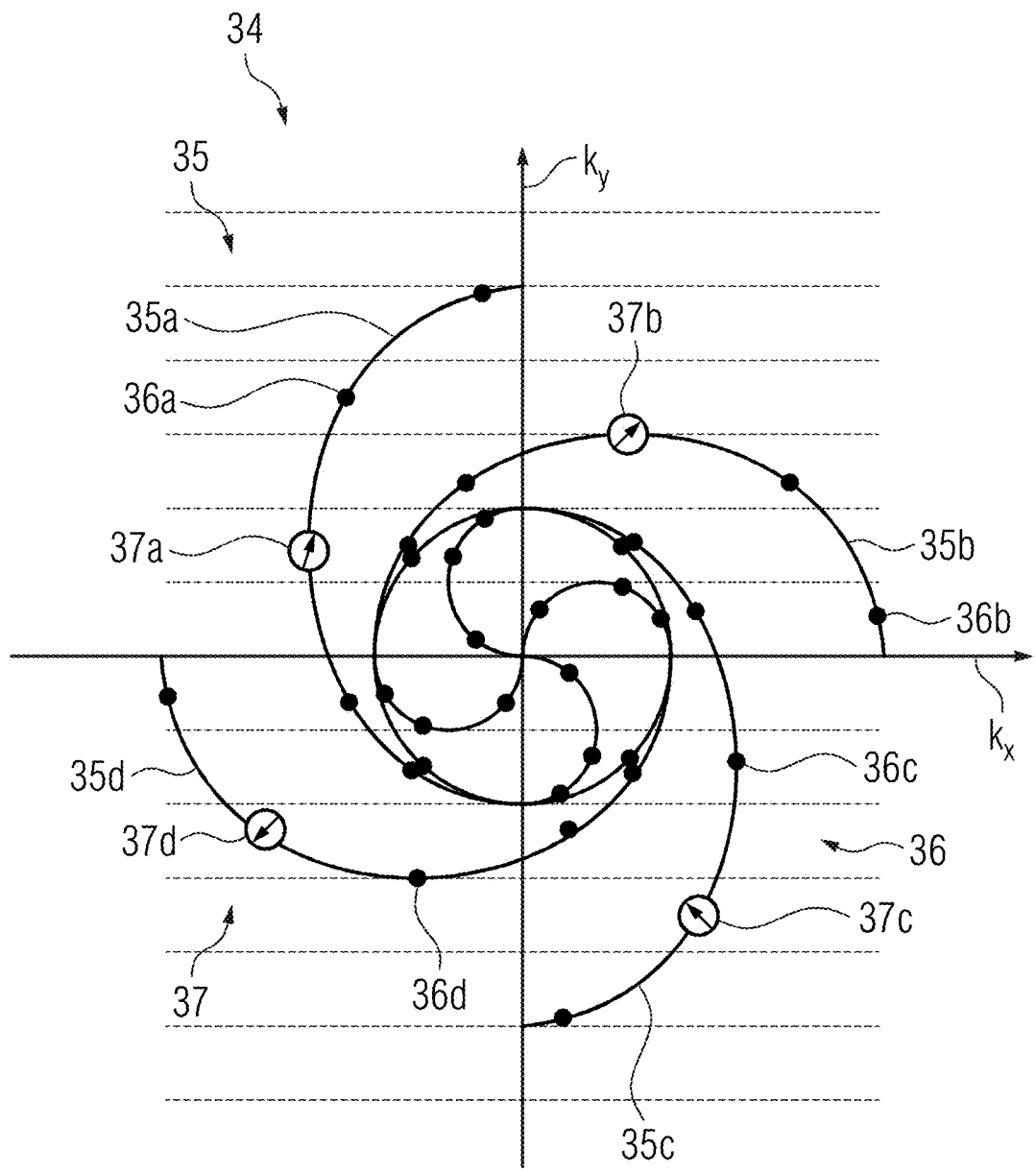
FIG. 3 shows a spiral k-space trajectory according to an exemplary embodiment of the disclosure.

FIG. 3 shows a k-space 34 with a spiral k-space trajectory 35 pertaining to the measurement sequences 11 to 13, having spirals 35a, 35b, 35c and 35d. The four spirals 35a, 35b, 35c and 35d have the same form, but are rotated in 90° steps towards each other. Consequently, denser sampling of the k-space 34 results in the center.

By way of example, some read-out points 36 at which measurement signals 32 are acquired are provided with reference numerals. This is a known visual representation for the spatial encoding of the measurement signals 32.

By way of example, one phase 37a, 37b, 37c and 37d of the phase distribution 37 of the k-space trajectory 35 is shown in the known clock hand presentation at four read-out points 36. One phase exists at each read-out point even if only some were displayed. Each read-out point 36 has its own phase.

The use of a plurality of spirals 35a, 35b, 35c and 35d as the spiral k-space trajectory 35 is one possible embodiment of a spiral trajectory.

Figure 4:
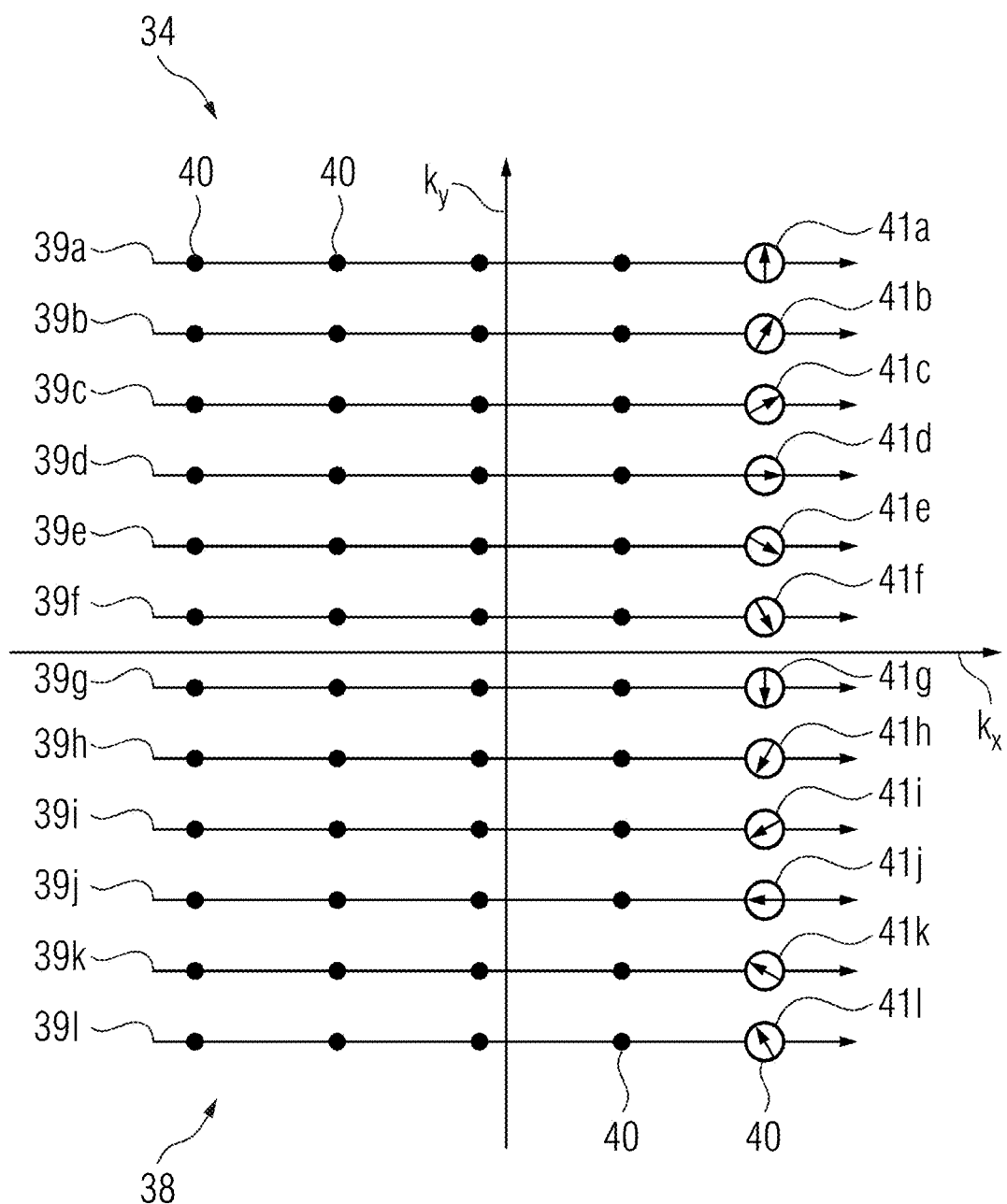
FIG. 4 shows a Cartesian k-space trajectory with unconnected k-space rows according to an exemplary embodiment of the disclosure.

FIG. 4 shows a k-space 34 with a k-space trajectory 38 pertaining to the measurement sequences 14 or 16, having k-space rows 39a to 39l. The read-out points 40 are located here on the k-space rows 39a to 39l. The k-space trajectory 38 is composed of individual, unconnected k-space rows 39a to 39l. The arrowheads at the ends of the k-space rows are intended to represent the uniformity of the read-out direction but have no significance otherwise.

The phases 41a to 41l of the k-space rows 39a to 39l are again represented by a clock hand presentation. The read-out points 40 of a k-space row always have the same phase in this case.

Figure 5:
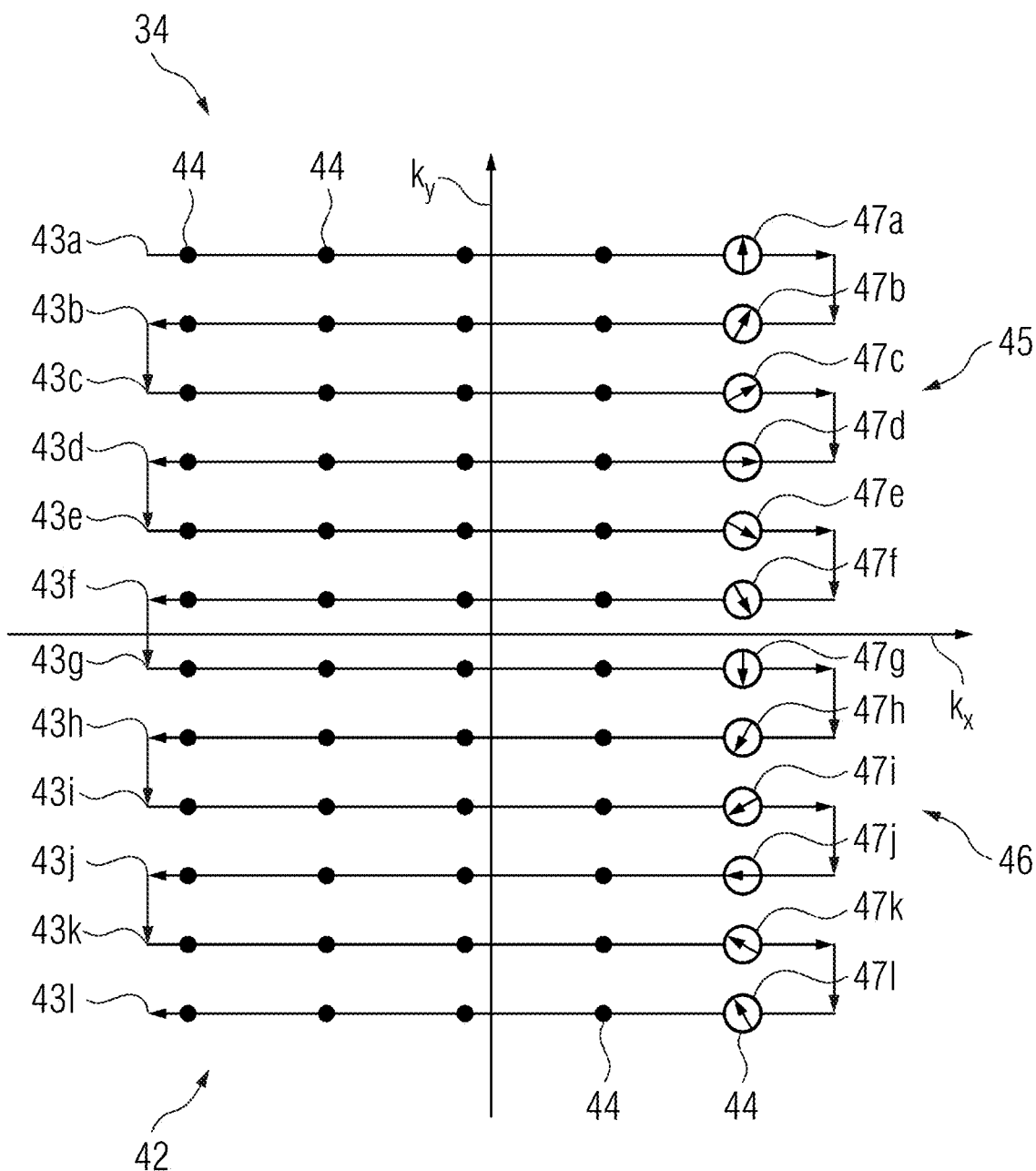
FIG. 5 shows a Cartesian k-space trajectory with connected k-space rows according to an exemplary embodiment of the disclosure.

FIG. 5 shows a k-space 34 with a k-space trajectory 42 pertaining to the EPI measurement sequence 15, having k-space rows 43a to 43l. The read-out points 44 are located here on the k-space rows 43a to 43l. The k-space trajectory 42 is composed of connected k-space rows 43a to 43f and 43g to 43l, which are arranged in two blocks 45 and 46. In other words, the measurement is segmented. As described above, the blocks 45 and 46 conventionally have more than two k-space rows. Only a few k-space rows are shown for the sake of clarity.

The phases 47a to 47l of the k-space rows 43a to 43l are represented by a clock hand presentation in FIG. 5 too. The read-out points 44 of a k-space row always have the same phase in this case.

As already described several times, a k-space trajectory, the k-space trajectory 42 as well, therefore, comprises all measurement signals 32, represented here by read-out points 44, which are used when generating an image data set. It thereby includes the two blocks 45 and 46 and not just one of them.

FIG. 6 schematically shows an acquisition method for acquiring an MRF data set. The numbers of the acquired MRF image data sets are plotted on the axis 48 and different sizes on the axis 49. As the first size, the flip angle is plotted in ° from 0° at the origin to 90° at axis point 50. The axis 48 runs from the MRF image data set 1 to the MRF image data set 3,000.

The 3,000 MRF image data sets are distributed among 11 sections 51, 52, 53, 54, 55, 56, 57, 58, 59 and 60.

In the first section 51, the flip angle of the FISP measurement sequence 12, which was used on acquisition, is plotted over the curve 62 for two hundred MRF image data sets. As is described in relation to FIG. 2, after the application of a radio frequency pulse with a particular flip angle, a complete spiral is acquired and then the next radio frequency pulse with the next flip angle is applied and a further spiral, rotated by 90°, is sampled. FIG. 6 accordingly shows in section 51 a flip angle distribution, which corresponds to a $\sin^2$ curve. The maximum flip angle is 24° and constant phases are used.

Purely by way of example, a line 63 is plotted for the hundredth MRF image data set. The corresponding flip angle is the maximum flip angle of the curve 62.

Four hundred MRF image data sets are acquired in the second section 52 with the TrueFISP sequence 13 according to FIG. 2. Flip angles according to the curves 64 and 65 are used in the process. These extend to 45° in the case of curve 64 and to 72° in the case of curve 65.

Purely by way of example for the section 52 as well, a line 66 is plotted for the four hundredth MRF image data set. Here the flip angle is 1°.

The use of two different phase cycles in section 52 represents a peculiarity. No phase cycle is used on running through the flip angles of the curve 64 and a 180° phase cycle is used on running through the curve 65.

In the following section 53, the flip angles for acquisition of 450 MRF image data sets with a FLASH measurement sequence 12 are indicated in the curve 67. These angles are smaller than in the FISP or TrueFISP measurement sequence and run to 6°. Their distribution is also a $\sin^2$ distribution.

In addition to the variation of the flip angle, a phase cycle for the implementation of RF spoiling is applied in the case of repeated run-throughs of the FLASH sequence. The phase is increased by multiples of 117° in this case.

The sequence of measurement sequences 11, 12 and 13 together form a block 61. This is used a total of three times in FIG. 6. Solely the type of measurement sequence but not the number of MRF image data sets or the flip angle curves is applied here.

Two hundred MRF image data sets are again acquired in section 54 with a FISP sequence 11. As in section 51, the phase is constant, but the maximum flip angle is 45°. These lie on the curve 68.

Two hundred MRF image data sets follow in section 55, which are to be acquired with a TrueFISP measurement sequence 13. Here a 90° phase cycle is used, the maximum flip angle is 50°. The flip angles are plotted on the curve 69.

The next approximately 450 MRF image data sets in section 56 are to be acquired, as in section 53, with a FLASH measurement sequence 12. The curve 70 shows a sine distribution with a maximum value of 14°.

The curve 71 in section 57 runs to 72° and shows the flip angles of the radio frequency pulse 24 or 33 on the third use of a FISP measurement sequence 11. The phase is constant in this run too.

A 270°-phase cycle is used when acquiring a further two hundred MFR image data sets in section 58 with a TrueFISP measurement sequence 13 according to FIG. 2. The flip angles, which are plotted in the curve 72, run to 65°.

The next approximately 450 MRF image data sets in section 59 are acquired with the FLASH measurement sequence 16. The curve 73 represents a flip angle characteristic to a maximum of 20°, again $\sin^2$-distributed.

Up to this section, measurement sequences with spiral trajectories were always used for sampling the k-space. The acquired raw data sets are first raw data sets. The measurement signals sampled on spirals are each four successive MRF image data sets combined to form a first raw data set. The number of first raw data sets is a quarter of the number of MRF image data sets, therefore.

Cartesian sampling, as is shown in FIG. 4, is used below.

In the last section 60 there are two curves 74 and 75 for the acquisition of second raw data sets with a FISP measurement sequence 14. These in turn represent flip angle characteristics. As in the preceding sections already, a constant phase is used in the FISP measurement sequence 18. A plurality of k-space rows, which are used for generating an MRF image data set, can be acquired with the same flip angle. A second raw data set then comprises, as in the case of the first raw data set, a particular multiple of the plurality of k-space rows. For example, four k-space rows can be used for reconstruction of an MRF image data set and sixteen, in other words, four times four, for reconstruction of a reference image data set. Accordingly, the k-space trajectory of the second raw data set comprises sixteen unconnected k-space rows.

The section with the Cartesian-sampled second raw data sets forms a block 76.

To summarize, it can be maintained that, irrespective of the specific number of images and the maximum flip angles in each case, preferably one $\sin^2$-distributed flip angle characteristic is used in all sections. It is also possible for significantly fewer image data sets to be acquired in one section, but preferably at least 10.

The first and second raw data sets thus acquired together form an MRF data set.

There has to be only a single second raw data set present in order to carry out the method. In this example a plurality of second raw data sets is acquired to sample the curves 74 and 75. The second raw data sets can then also be used for generating a plurality of MRF image data sets respectively.

Figure 7:
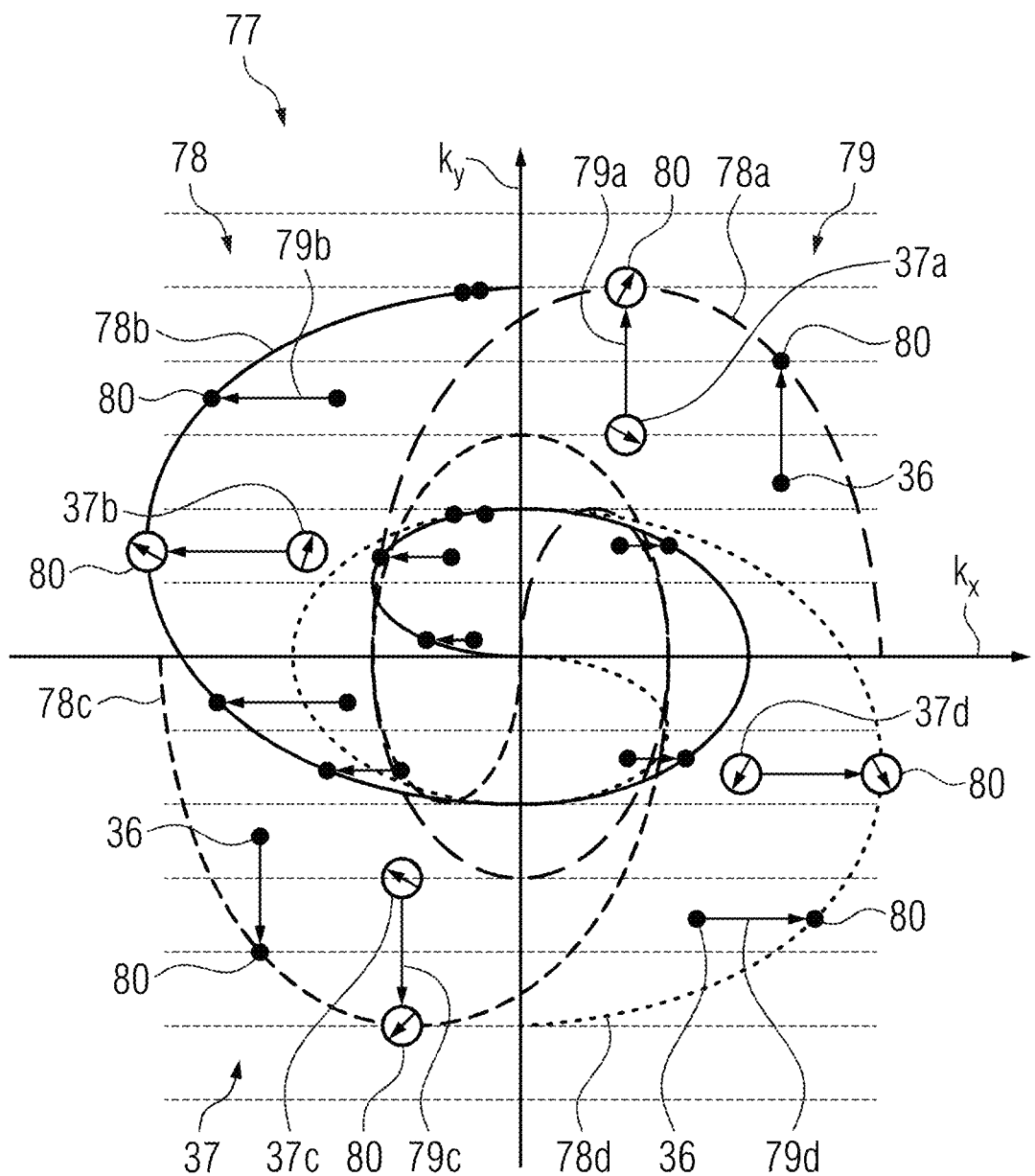
FIG. 7 shows a corrected first raw data set according to an exemplary embodiment of the disclosure.

FIG. 7 shows a corrected first raw data set 77 with a corrected k-space trajectory 78. A distortion correction coefficient set 79 has been applied to a first raw data set. Of the distortion correction coefficient set 79, by way of example the shift vectors 79a to 79d are provided with reference numerals. Consequently, the read-out points 36 are shifted to corrected read-out points 80.

Each shift vector 79a to 79d causes a local shift of the read-out points 36 in the k-space 34 and/or a phase shift of the phase 37a to 37c, with both shifts being shown in FIG. 7. It can also be designed as an identity shift, however. In this case it does not change anything. Both the read-out point and the phase are parameters of a single measurement signal, for which reason the distortion correction of these parameters can also be combined in each case in a single shift vector 79a to 79d.

The effect of a distortion correction coefficient set 79 is shown by way of example for four spirals 78a to 78d of a spiral k-space trajectory 78. With spiral sampling, it is possible to use a plurality of mutually offset or rotated spirals in addition to just one spiral. Of course, corresponding shift vectors and distortion correction coefficient sets 79 can be used for any k-space trajectories.

FIG. 8 shows a first embodiment for the reconstruction of image data sets. Starting from a first raw data set 17, corrected first raw data sets 77, 84, 85 and 86 are generated by application of distortion correction coefficient sets 79, 81, 82 and 83. One image data set 87, 88, 89 and 90 is generated from each corrected first raw data set 77, 84, 85 and 86.

A reference image data set 91 is generated from the second raw data set 20 without modifications.

The image data sets 87, 88, 89 and 90 are compared with the reference image data set 91 and one similarity value $a_{87}$, $a_{88}$, $a_{89}$ and $a_{90}$ respectively determined. The image data set with the greatest similarity value is selected.

If this is, for example, the image data set 90, and if this is part of an MRF data set, then MRF image data sets 90a, 90b, 90c and 90d are generated from individual spirals 78a to 78d of the k-space trajectory 78 of the image data set 90.

In connection with MR fingerprinting the reference image data set 91 can similarly be acquired with varying measurement parameters on acquisition of the k-space rows. MRF image data sets 91a, 91b, 91c and 91d can then also be generated from the reference image data set 91. A signal curve is created for each of the image elements from the MRF image data sets 90a, 90b, 90c, 90d, 91a, 91b, 91c and 91d and compared with a dictionary. In this way, values are obtained for, for example, T1, T2, B0 and B1 for each image element.

The MRF image data sets 90a, 90b, 90c and 90d are sub-sampled four times in the comparison with the image data set 90 and the MRF image data sets 91a, 91b, 91c and 91d are sub-sampled four times in the comparison with the reference image data set 91. This is possible, however, since the MRF image data sets 90a, 90b, 90c, 90d, 91a, 91b, 91c and 91d are used, as described, for creating signal curves and not for direct consideration.

FIG. 9 shows a flowchart of a second embodiment for generating an image data set.

In step S1, a first raw data set 17 and a second raw data set 20 are provided. The first raw data set 17 is acquired with spiral sampling and the second raw data set 20 with Cartesian sampling.

In step S2, the k-space trajectory of the first raw data set 17 is shifted using a first distortion correction coefficient set 79 and a Cartesian intermediate data set is generated from the corrected k-space trajectory 78 by means of re-gridding. This intermediate data set is reconstructed by means of Fourier transform to form a first image data set 87.

The re-gridding and the Fourier transform are customary reconstruction steps in the reconstruction of raw data sets with spiral trajectories.

A second image data set 88 is then reconstructed in step S3 from the same first raw data set 17 using a second distortion correction coefficient set 81.

In the following step S4, a reference image data set 91 is reconstructed from the second raw data set 20. Similarity measures $a_{87}$ and $a_{88}$ are then determined in step S5. The distortion correction coefficient set pertaining to the image data set with the greater similarity measure is used as the starting basis when determining a third distortion correction coefficient set 82. Let the first distortion correction coefficient set 79 be the one whose image data set had the greater similarity measure. For example, the shift vectors of the first distortion correction coefficient set 79 can then receive a positive "entry" and those of the second distortion correction coefficient set 81 a negative one.

In step S6, a third image data set 89 is reconstructed from the above-mentioned first raw data set 17 using the third distortion correction coefficient set 82 and a similarity measure $a_{89}$ determined in relation to the reference image data set 86. Depending on whether the similarity measure $a_{89}$ is greater or smaller than the previous best similarity measure, the third distortion correction coefficient set 82 continues to be used or the first distortion correction coefficient set 79.

Of course, at the beginning more than two distortion correction coefficient sets can be used to define a starting basis. In particular, the initial distortion correction coefficient sets can satisfy predefined specifications, for example shift only in the center or only in the outer region.

Starting from this iterative adjustment of the distortion correction coefficient sets the method can be continued until an abort criterion is met. This can be a maximum iteration step or the attainment of a predefined similarity measure.

The method can then conclude with the existence of just a first raw data set.

If, however, as FIG. 6 shows, a large number of first raw data sets exists, the distortion correction coefficient set, which pertains to the image data set with the greatest similarity measure, can be stored in step S7. This is used to also correct distortions in other first raw data sets and reconstruct MRF image data sets therefrom.

As the first raw data set 17 a raw data set is used, which was acquired with the same measurement sequence as the second raw data set. This was the FISP measurement sequence in the example relating to FIG. 6.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for generating at least one image data set and one reference image data set of an examination object from at least two raw data sets, the method comprising:
    providing a first raw data set acquired with a magnetic resonance system, the first raw data set including measurement signals at a plurality of read-out points in k-space that lie on a first k-space trajectory;
    providing a second raw data set acquired with the same magnetic resonance system and at the same examination object as the first raw data set, the second raw data set including measurement signals at a plurality of read-out points that lie on a second k-space trajectory that is different from the first k-space trajectory;
    reconstructing a plurality of image data sets from the first raw data set, wherein before reconstruction of each of the plurality of image data sets, using a separate distortion correction coefficient set that defines a corresponding shift of the read-out points of the measurement signals of the first raw data set in k-space;
    reconstructing a reference image data set from the second raw data set;
    comparing the reference image data set with each image data set of the plurality of image data sets to generate respective similarity values, wherein comparing the reference image data set with each image data, set of the plurality of image data sets comprises comparing edges of each of the image data sets with edges of the reference image data set, the respective similarity values being generated based on the comparison of the respective edges of each of the image data sets with edges of the reference image data set; and
    selecting an image data set from the plurality of image data sets having a greatest similarity value of the similarity values.

2. The method as claimed in claim 1, wherein a spiral trajectory is used, as the first k-space trajectory, in which at least a portion of k-space is sampled with a read gradient that varies over time.

3. The method as claimed in claim 2, wherein a Cartesian distribution of the plurality of read-out points is used as the second k-space trajectory.

4. The method as claimed in claim 1, wherein a Cartesian distribution of the plurality of read-out points is used as the second k-space trajectory.

5. The method as claimed in claim 1, wherein, when generating at least one of the distortion correction coefficient sets, a model of gradient deviation during acquisition of the first raw data set is used.

6. The method as claimed in claim 1, wherein at least one of the distortion correction coefficient sets is generated with random numbers.

7. The method as claimed in claim 1, wherein a maximum shift is specified for the measurement signals.

8. The method as claimed in claim 1, wherein a plurality of partial data sets is provided as the first raw data set, the plurality of partial data sets being acquired with at least one different measurement parameter including: a flip angle of an excitation pulse and/or a repetition time.

9. The method as claimed in claim 1, wherein a plurality of first raw data sets are provided, and, for the first raw data set, a distortion correction coefficient set is selected, which is used for all of the plurality of first raw data sets.

10. The method as claimed in claim 1, wherein after the reconstruction of at least two image data sets, of the plurality of image data sets, from the first raw data set, using two different distortion correction coefficient sets, resulting similarity values are considered when generating a third distortion correction coefficient set.

11. The method as claimed in claim 1, wherein the first raw data set is acquired with a first measurement sequence and a measurement sequence for acquisition of the second raw data set is selected such that image data sets reconstructed from the first and the second raw data sets have a same contrast.

12. The method as claimed in claim 1, wherein the distortion correction coefficient set also defines a phase shift.

13. A non-transitory computer-readable storage medium with an executable program stored thereon, that when executed, instructs a controller of the magnetic resonance system to perform the method of claim 1.

14. A computer program product, embodied on a non-transitory computer-readable storage medium, which includes a program and is directly loadable into a memory of the magnetic resonance system, when executed by an image generator of the magnetic resonance system, causes the image generator to perform the method as claimed in claim 1.

15. The method as claimed in claim 1, wherein:
providing the first raw data set comprises controlling the magnetic resonance system to acquire the first raw data set; and
providing the second raw data set comprises controlling the magnetic resonance system to acquire the second raw data set.

16. The method as claimed in claim 15, wherein:
controlling the magnetic resonance system to acquire the first raw data set comprises controlling the magnetic resonance system to perform a first measurement sequence to acquire the first raw data set; and
controlling the magnetic resonance system to acquire the second raw data set comprises controlling the magnetic resonance system to perform a second measurement sequence to acquire the second raw data set.

17. The method as claimed in claim 16, wherein the first measurement sequence and the second measurement sequence are the same, and wherein acquisition of the first raw data set and acquisition of the raw data set are performed using different sampling patterns.

18. The method as claimed in claim 16, wherein the first measurement sequence and the second measurement sequence are different.

19. The method as claimed in claim 1, wherein reconstructing the plurality of image data sets from the first raw data set comprises:
performing re-gridding on the plurality of image data sets to determine a plurality of respective intermediate data sets; and
performing Fourier transformations on the plurality of intermediate data sets to determine the plurality of image data sets.

20. A controller for a magnetic resonance (MR) system, comprising:
a memory configured to store computer instructions; and
a processor configured to execute the computer instructions to cause the processor to:
obtain a first raw data set of an examination object and acquired with the MR system, the first raw data set including measurement signals at a plurality of read-out points in k-space that lie on a first k-space trajectory;
obtain a second raw data set acquired with the same MR system and at the same examination object as the first raw data set, the second raw data set including measurement signals at a plurality of read-out points that lie on a second k-space trajectory that is different from the first k-space trajectory;
reconstruct a plurality of image data sets from the first raw data set, wherein before reconstruction of each of the plurality of image data sets, using a separate distortion correction coefficient set that defines a corresponding shift of the read-out points of the measurement signals of the first raw data set in k-space;
reconstruct a reference image data set from the second raw data set;
compare the reference image data set with each image data set of the plurality of image data sets to generate respective similarity values, wherein comparing the reference image data set with each image data set of the plurality of image data sets comprises comparing edges of each of the image data sets with edges of the reference image data set, the respective similarity values being generated based on the comparison of the respective edges of each of the image data sets with edges of the reference image data set; and
select an image data set from the plurality of image data sets having a greatest similarity value of the similarity values.

\* \* \* \* \*